United States Patent [19]

Nakamura et al.

[11] Patent Number: 5,422,490
[45] Date of Patent: Jun. 6, 1995

[54] FOCUSED ION BEAM IMPLANTATION APPARATUS

[75] Inventors: Takao Nakamura; Michitomo Iiyama, both of Osaka, Japan

[73] Assignee: Sumitomo Electric Industries, Ltd., Osaka, Japan

[21] Appl. No.: 83,035

[22] Filed: Jun. 29, 1993

[30] Foreign Application Priority Data

Jun. 29, 1992 [JP] Japan ................. 4-194901

[51] Int. Cl.$^6$ ........................................... H01J 37/317
[52] U.S. Cl. .................. 250/492.21; 250/398; 250/491.1
[58] Field of Search ............. 250/492.21, 398, 491.1

[56] References Cited

U.S. PATENT DOCUMENTS

| | | | |
|---|---|---|---|
| 4,117,339 | 9/1978 | Wolfe | 250/492 |
| 4,334,139 | 6/1982 | Wittekoek et al. | 250/491.1 |
| 4,710,639 | 12/1987 | Sawaragi | 250/492.21 |

FOREIGN PATENT DOCUMENTS

| | | |
|---|---|---|
| 0477992 | 1/1992 | European Pat. Off. . |
| 0476479 | 3/1992 | European Pat. Off. . |

OTHER PUBLICATIONS

Akaike, et al., *Submicrometer-Scale Patterning of Superconducting Nb Films Using Focused Ion Beam*, J. Appl. Phys., vol. 31 (1992), pp. L410-L412.

Patent Abstracts of Japan, vol. 16, No. 275 (E-1219), 19 Jun. 1992.

*Primary Examiner*—Jack I. Berman
*Attorney, Agent, or Firm*—Foley & Lardner

[57] ABSTRACT

A focused ion beam implantation apparatus comprises a vacuum chamber, an ion source generating an ion beam, a means for accelerating the ion beam, a means for eliminating unwanted ion species in the ion beam, and a means for focusing the ion beam on a target. The apparatus further includes a means for scanning the ion beam relative to the target and means for inclining the ion beam relative to the target.

11 Claims, 2 Drawing Sheets

FOCUSED ION BEAM IMPLANTATION APPARATUS

BACKGROUND OF THE INVENTION

1. Field of the Invention

The present invention relates to an ion implantation apparatus, and more specifically to a focused ion beam implantation apparatus comprising means for inclining a focused ion beam at a large angle with accurate positioning.

2. Description of Related Art

Ion implantation is the introduction of energetic, charged particles into a target such as semiconductor wafer, etc. Ion implantation has been mainly used in semiconductor technology to change the electrical properties of the particular region in the semiconductor substrate. In semiconductor technology, it is not necessary to form an ion-implanted region in complicated shape, so that the ion beam is only scanned relative to the target.

Recently, ion implantation has been applied to processing of an oxide superconductor thin film such as Y-Ba-Cu-O type oxide superconductor, Bi-Sr-Ca-Cu-O type oxide superconductor or Tl-Ba-Ca-Cu-O type oxide superconductor. For example, by implanting proper ion into the oxide superconductor thin film, an insulating region is formed in the oxide superconductor thin film so that a specified superconducting region can be left without damaging the oxide superconductor thin film itself. By contrast, superconducting properties of the oxide superconductor are easily spoiled, if the oxide superconductor thin film is processed by a conventional etching process. In addition, fine processing is possible by using a finely focused ion beam. Therefore, ion implantation is considered one of the best means for processing the oxide superconductor thin film.

In order to manufacture a superconducting device using the oxide superconductor, it is necessary to form an insulating region having a complicated sectional shape in the oxide superconductor thin film. Thus, it is necessary to implant an ion beam at various incident angles with accurate positioning.

However, as mentioned above, a conventional ion implantation apparatus used in semiconductor technology is not designed to incline the ion beam at a large angle relative to the target. If the target is inclined so as to implant the ion beam at a large incident angle, the position at which the ion beam is implanted may deviate. As a result, it has been difficult to form the insulating region having a complicated sectional shape in an oxide superconductor thin film with precise positioning. For example, even if the ion beam is focused to narrower than 0.1 $\mu$m, the positioning of the ion-implanted region has to be determined with accuracy better than 0.02 $\mu$m.

SUMMARY OF THE INVENTION

Accordingly, it is an object of the present invention to provide an ion implantation apparatus which has overcome the above mentioned defect of the conventional one.

Another object of the present invention is to provide an ion implantation apparatus which comprises means for scanning and inclining the ion beam relative to the target.

The above and other objects of the present invention are achieved in accordance with the present invention by an ion implantation apparatus comprising a vacuum chamber, an ion source generating an ion beam, a means for accelerating the ion beam, a means for eliminating unwanted ion species in the ion beam, a means for focusing the ion beam on a target, a means for scanning the ion beam relative to the target and means for inclining the ion beam relative to the target.

The apparatus in accordance with the present invention preferably comprises a means for controlling the scanning means and the inclining means, which controls the scanning means and the inclining means so as to reduce the displacement which is generated by the inclination of the iron beam relative to the target to zero, so that the ion beam is implanted onto the target at a predetermined position at a predetermined incident angle.

As a result, an ion beam can be implanted with a high degree of freedom so that it becomes easy to implant the ion beam to a target at any portion at a large incident angle so as to form an ion-implanted region having a complicated sectional shape.

In a preferred embodiment, the scanning means comprises two sets of three pairs of electrodes arranged along the axis of the ion beam so that the ion beam passes between each pair of the electrodes and one set of which is disposed on a plane including the axis of the ion beam and the other set is disposed on a plane perpendicular to that of the first set, which also includes the axis of the ion beam.

It is preferable that the electrodes also function as the inclining means. Namely, in this case, the ion beam is displaced and/or inclined by the electric fields generated by the voltages applied to the electrodes.

The scanning means preferably includes a X-Y stage on which the target is mounted. The X-Y stage is preferably mounted on a tilting device which composes the inclining means.

In the apparatus in accordance with the present invention, the control means preferably includes a micro computer.

The above and other objects, features and advantages of the present invention will be apparent from the following description of preferred embodiments of the invention with reference to the accompanying drawings.

DETAILED DESCRIPTION OF THE PREFERRED EMBODIMENTS

Figure 1:
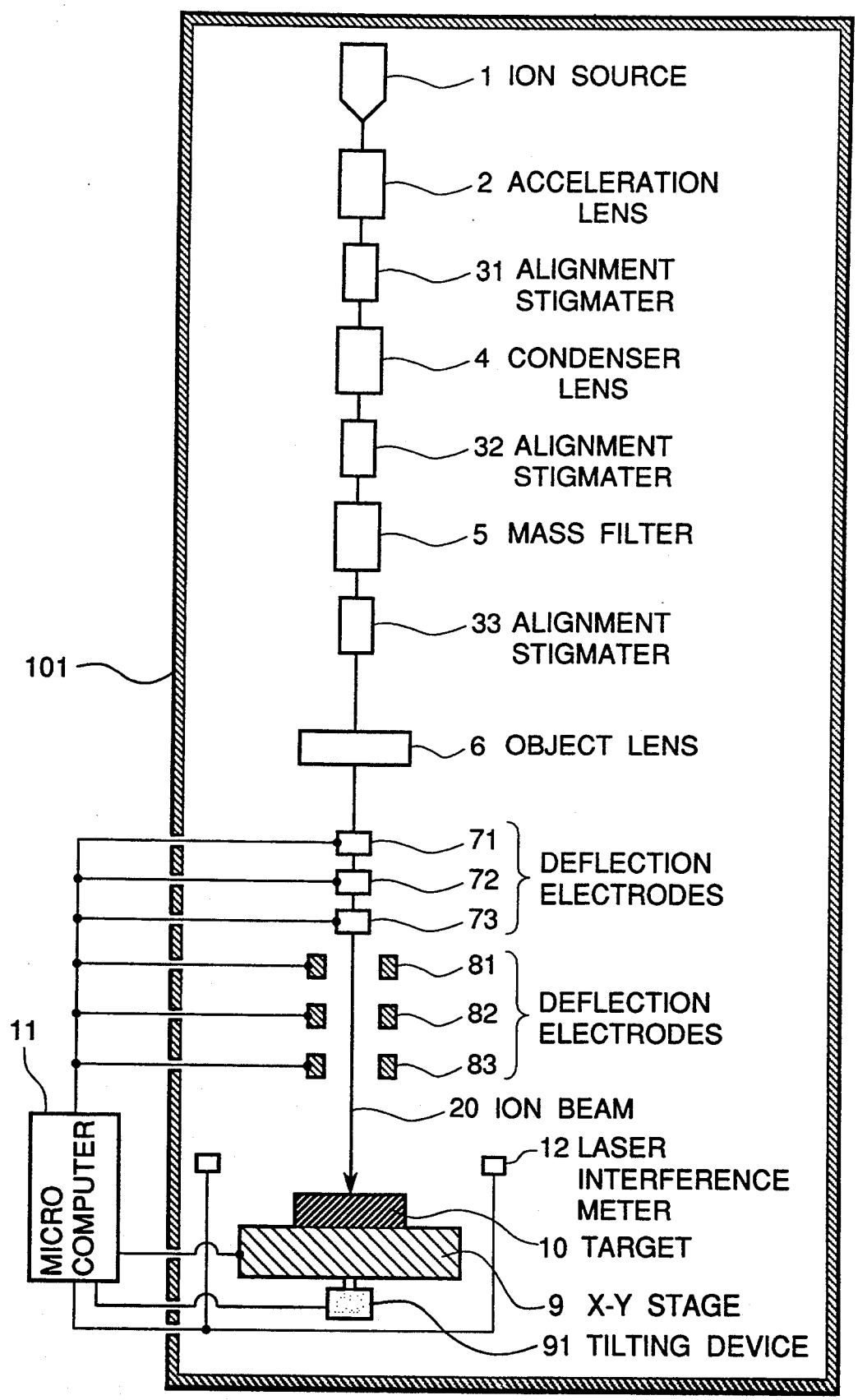
FIG. 1 is a schematic view of an ion implantation apparatus in accordance with the present invention.

Referring to FIG. 1, there is shown a schematic view of an ion implantation apparatus in accordance with the present invention. In FIG. 1, the apparatus comprises a vacuum chamber 101 whose inside pressure is evacuated to a pressure lower than $1 \times 10^{-5}$ Torr. In the vacuum chamber 101, an ion source 1, an acceleration lens 2, a first alignment stigmater 31, a condenser lens 4, a second alignment stigmater 32, a mass filter 5, a third alignment stigmater 33 and an object lens 6 are arranged from the top to the bottom in the named order on a common electro-optical axis. An ion beam 20 generated by the ion source 1 is accelerated by the acceleration lens 2 and shaped by the alignment stigmaters 31, 32 and 33, condenser lens 4 and object lens 6. Unwanted ion species in the ion beam 20 are eliminated by the mass filter 5. In this embodiment, the ion beam 20 can be focused to narrower than 0.1 μm.

Under the object lens 6, three pairs of X direction deflection electrodes 71, 72 and 73, and three pairs of Y direction deflection electrodes 81, 82 and 83 are disposed. At the bottom of the chamber 101, an X-Y stage 9 which is mounted on a tilting device 91 is arranged. A target 10 such as a substrate with an oxide thin film formed on it is held on the X-Y stage 90. Of course, the tilting device 91 on which the target 10 is set can be mounted on the X-Y stage 9, alternately. A laser interferometer 12 is arranged near the X-Y stage 9 which measures the height of the target 10, namely, the distance between the deflection electrode 83 and the target 10. By applying proper voltages to the deflection electrodes 71, 72, 73, 81, 82 and 83, the ion beam 20 can be inclined at an angle and shifted in any direction. In addition, the target 10 can be inclined by the tilting device 91 and moved by the X-Y stage 9. Therefore, the ion beam 20 can be implanted at any position of the target 10 at a large incident angle. For example, stepping motors are utilized in the X-Y stage 9 and the tilting device 91 so that the displacement of the X-Y stage 9 and the angular displacement of the tilting device 91 are accurately controlled with a precision of 10 nanometers and 0.01 degrees. The tilting device 91 includes, for example, a ball joint or a cross joint so that the X-Y stage can be inclined in any direction. In addition, it is preferable that the X-Y stage 9 and the tilting device 91 does not discharge any dust nor any gas which contaminate the target 10 and destroy the vacuum of the chamber 101.

The apparatus further includes a control means such as a micro computer 11 outside of the chamber 101, which is connected to and controls the deflection electrodes 71, 72, 73, 81, 82 and 83, the X-Y stage 9, the tilting device 91 stimulated by the signal from the laser interferometer 12. The micro computer sends adequate signals to the deflection electrodes 71, 72, 73, 81, 82 and 83, the X-Y stage 9 and the tilting device 91. To illustrate, when a request is made to implant an ion beam onto the target 10 at a predetermined position at a predetermined angle, the position and the angle should be inputted to the micro computer 11. The micro computer 11 gives signals to the deflection electrodes 71, 72, 73, 81, 82 and 83, the X-Y stage 9 and the tilting device 91 such that the appropriate voltages are applied to the deflection electrodes 71, 72, 73, 81, 82 and 83, causing the substrate to be displaced and inclined by the X-Y stage 9 and the tilting device 91, the amount of displacement and tilt corresponding to the desired implanting position, the desired incident angle and the height of the target 10. If necessary, feedback control is applied using the signal from the laser interferometer 12. As a result, the ion beam 20 can be implanted with a high degree of freedom so that it becomes easy to implant the ion beam 20 to the target 10 at any portion at a large incident angle so as to form an ion-implanted region having a complicated sectional shape.

In addition, if the ion source 1, the acceleration lens 2, the alignment stigmater 31, 32 and 33, the condenser lens 4, the mass filter 5 and the object lens 6 are controlled by the micro computer 11, it becomes possible to carry out the ion implantation process automatically.

Figure 2A:
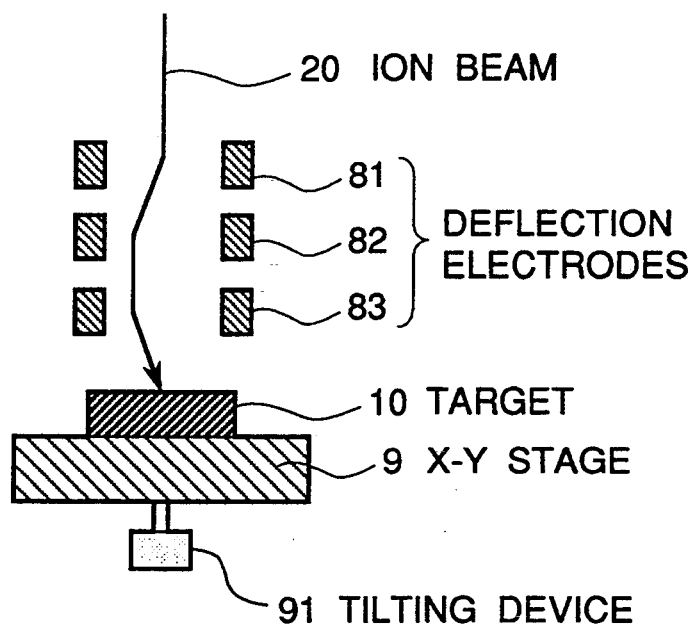
FIGS. 2A and 2B are schematic views for illustrating characteristic operations of the apparatus shown in FIG. 1.
Figure 2B:
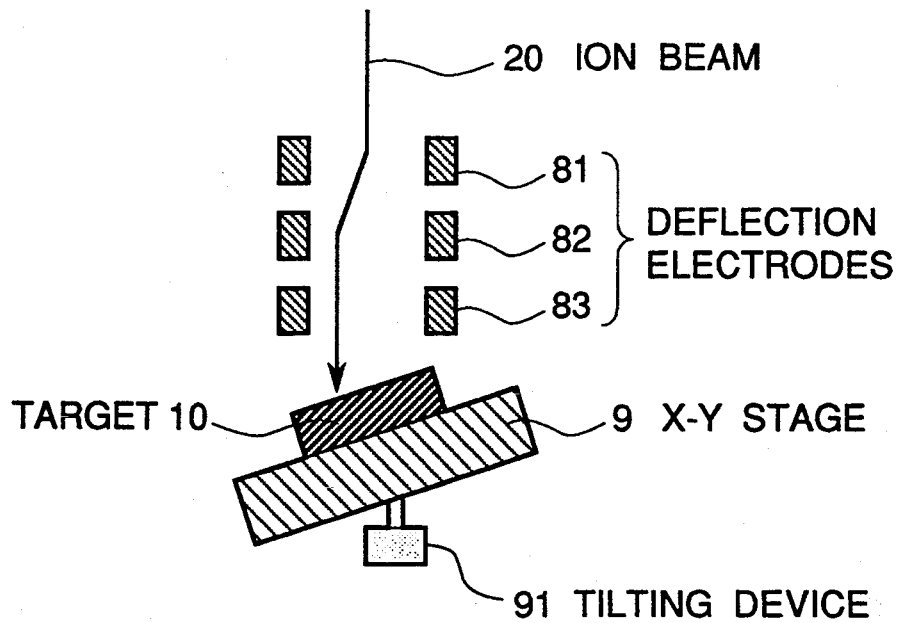

Referring to FIGS. 2A and 2B, the ion beam 20 is implanted onto the target 10 at an incident angle not coincident to the perpendicular axis of the target 10 by utilizing the apparatus in accordance with the present invention. In FIGS. 2A and 2B, the ion beam 20 is deflected in the Y-direction (parallel to the surface of the paper). In the same manner, the ion beam can be deflected in the X-direction (perpendicular to the surface of the paper) and also in any direction perpendicular to the axis of the apparatus.

In FIG. 2A, the target 10 is not inclined but the ion beam 20 is deflected so that the ion beam 20 is implanted onto the target 10 at an incident angle not coincident to the perpendicular axis of the target 10. In this case, a voltage which generates an electric field deflecting the ion beam 20 to the left is applied to the deflection electrodes 81, a second voltage which cancels the first electric field is applied to the deflection electrodes 82, and a third voltage equal and in the same direction as the second is applied to the deflection electrodes 83. The intensity of the electric fields is controlled so that the ion beam 20 can be implanted at the portion at which the straight ion beam would have been implanted. However, even if the ion beam 20 deviates from its desired position, the X-Y stage 9 is controlled to move the target 10 in such a direction as to reduce the deviation to zero, so that the ion beam 20 is implanted onto the right portion of the target 10.

In FIG. 2B, the target 10 is inclined and the ion beam 20 is shifted in the direction perpendicular to the axis so that the ion beam 20 is implanted onto the target 10 at an incident angle not coincident to the perpendicular axis of the target. In this case, a voltage which generates an electric field deflecting the ion beam 20 to the left is applied to the deflection electrodes 81 and another voltage generating an electric field which cancels the first electric field is applied to the deflection electrodes 82 so that the ion beam 20 travels parallel to its initial axis. The target 10 is inclined so that the ion beam 20 is implanted at the predetermined incident angle. If the inclination causes the target 10 to deviate from its desired position, the X-Y stage 9 is controlled to move the target 10 in such a direction as to reduce the deviation to zero, so that the ion beam 20 is implanted onto the right portion of the target 10.

As explained above, if the above mentioned ion implantation apparatus is used in superconductor technology, an oxide superconductor thin film is processed accurately with a high degree of freedom. Accordingly, it is easy to manufacture superconducting devices such as a Josephson junction device, which is a superconducting field effect device with good repeatability and high performance.

The invention has thus been shown and described with reference to the specific embodiments. However, it should be noted that the present invention is in no way limited to the details of the illustrated structures but that changes and modifications may be made within the scope of the appended claims.

We claim:

1. A focused ion beam implantation apparatus comprising a vacuum chamber, an ion source generating an ion beam within the vacuum chamber, means for accelerating the ion beam, means for eliminating unwanted ion species in the ion beam, means for focusing the ion beam on a target, means for scanning the ion beam relative to the target, means for inclining the ion beam relative to the target, and means for uniformly controlling said scanning means and said inclining means to compensate for displacement generated by the inclination of the ion beam relative to the target, so that said ion beam is accurately directed onto said target at a predetermined position and at a relatively large predetermined incident angle.

2. A focused ion beam implantation apparatus claimed in claim 1 wherein the scanning means comprises a first and a second set of three pairs of electrodes arranged along the axis of the ion beam so that the ion beam passes between each pair of the electrodes, said first set is disposed on a plane including the axis of the ion beam and said second set is disposed on a plane also including the axis of the ion beam but perpendicular to the plane containing said first set.

3. A focused ion beam implantation apparatus claimed in claim 2 wherein the inclining means comprises the electrodes.

4. A focused ion beam implantation apparatus claimed in claim 2 wherein the scanning means further comprises an X-Y stage which moves the target relative to the ion beam.

5. A focused ion beam implantation apparatus claimed in claim 3 wherein the inclining means further comprises a tilting device which inclines the target relative to the ion beam.

6. A focused ion beam implantation apparatus claimed in claim 1 wherein the control means comprises a micro computer.

7. A focused ion beam implantation apparatus claimed in claim 2 wherein the apparatus further comprises means for measuring the distance between the electrodes and the target.

8. A focused ion beam implantation apparatus claimed in claim 7 wherein the measuring means comprises a laser interferometer.

9. A method of ion implantation using an ion beam focused onto a target at a predetermined position and at a predetermined inclination angle, said method comprising the steps of:
 (a) generating the ion beam within a vacuum chamber;
 (c) accelerating the ion beam;
 (d) eliminating unwanted ion species in the ion beam;
 (e) focusing the ion beam on the target; and
 (f) scanning and inclining the ion beam relative to the target, wherein said scanning and inclining is uniformly controlled as a function of the predetermined position, the predetermined inclination angle, and a positional error associated with inclining the ion beam relative to the target.

10. A method of ion implantation as claimed in claim 10 wherein the predetermined inclination angle is greater than zero when measured with respect to a line normal to a surface of the target.

11. A method of ion implantation as claimed in claim 10 wherein said scanning and inclining is controlled by a micro computer.

* * * * *